US008597776B2

(12) United States Patent
Watanabe et al.

(10) Patent No.: US 8,597,776 B2
(45) Date of Patent: Dec. 3, 2013

(54) CERAMIC MATERIAL, LAMINATE, MEMBER FOR USE IN SEMICONDUCTOR MANUFACTURING EQUIPMENT, AND SPUTTERING TARGET MEMBER

(75) Inventors: Morimichi Watanabe, Nagoya (JP); Asumi Jindo, Okazaki (JP); Yuji Katsuda, Tsushima (JP); Yosuke Sato, Hashima-County (JP); Yoshinori Isoda, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 13/478,508

(22) Filed: May 23, 2012

(65) Prior Publication Data
US 2012/0231243 A1 Sep. 13, 2012

Related U.S. Application Data

(63) Continuation of application No. PCT/JP2011/073329, filed on Oct. 11, 2011.

(30) Foreign Application Priority Data

Oct. 25, 2010 (JP) ................................ 2010-239000
Jun. 17, 2011 (JP) ................................ 2011-135312
Aug. 29, 2011 (JP) ..................... PCT/JP2011/069479

(51) Int. Cl.
*C04B 35/58* (2006.01)
*B32B 7/02* (2006.01)
*C23C 14/08* (2006.01)
*B32B 18/00* (2006.01)

(52) U.S. Cl.
USPC .......... 428/212; 428/697; 428/698; 501/98.5; 204/298.13

(58) Field of Classification Search
None
See application file for complete search history.

(56) References Cited

U.S. PATENT DOCUMENTS

| | | | | |
|---|---|---|---|---|
| 3,531,245 A | * | 9/1970 | Dietz | 423/351 |
| 5,231,062 A | * | 7/1993 | Mathers et al. | 501/96.1 |
| 5,314,675 A | | 5/1994 | Dubots et al. | |
| 5,336,280 A | | 8/1994 | Dubots et al. | |
| 5,457,075 A | * | 10/1995 | Fukushima et al. | 501/96.4 |
| 6,239,402 B1 | * | 5/2001 | Araki et al. | 219/121.4 |
| 7,255,934 B2 | | 8/2007 | Hatono et al. | |
| 2003/0128483 A1 | * | 7/2003 | Kamijo | 360/324.11 |
| 2005/0173412 A1 | | 8/2005 | Kondou et al. | |
| 2006/0240972 A1 | * | 10/2006 | Lee et al. | 501/98.5 |
| 2007/0258281 A1 | | 11/2007 | Ito et al. | |
| 2010/0104892 A1 | * | 4/2010 | Kobayashi et al. | 428/698 |

FOREIGN PATENT DOCUMENTS

| | | |
|---|---|---|
| JP | 62-028917 A1 | 2/1987 |
| JP | 04-304359 A1 | 10/1992 |
| JP | 05-319937 A1 | 12/1993 |
| JP | 06-037207 A1 | 2/1994 |

(Continued)

OTHER PUBLICATIONS

Weiss et al., "The System Al-Mg-O-N," Communications of the American Ceramic Society, C-68-C-69, 1982.*
Arielle Granon et al., "*Aluminum Magnesium Oxynitricle: A New Transparent Spinel Ceramic*," Journal of the European Ceramic Society, vol. 15, 1995, pp. 249-254.
U.S. Office Action dated Oct. 24, 2012 from U.S. Appl. No. 13/478,591.

(Continued)

*Primary Examiner* — David Sample
(74) *Attorney, Agent, or Firm* — Burr & Brown

(57) ABSTRACT

A ceramic material mainly contains magnesium, aluminum, oxygen, and nitrogen, in which the ceramic material has a magnesium-aluminum oxynitride phase serving as a main phase, wherein XRD peaks of the magnesium-aluminum oxynitride phase measured with CuKα radiation appear at at least $2\theta=47$ to $50°$.

19 Claims, 4 Drawing Sheets

(56) References Cited

FOREIGN PATENT DOCUMENTS

| | | |
|---|---|---|
| JP | 2000-044345 A1 | 2/2000 |
| JP | 3559426 B2 | 9/2004 |
| JP | 2005-203456 A1 | 7/2005 |
| JP | 2006-080116 A1 | 3/2006 |
| JP | 2007-084367 A1 | 4/2007 |
| JP | 2007-300079 A1 | 11/2007 |
| JP | 2008-115065 A1 | 5/2008 |
| JP | 2009-292688 A1 | 12/2009 |

OTHER PUBLICATIONS

International Search Report and Written Opinion dated Nov. 15, 2011 (with English translation).
U.S. Appl. No. 13/478,591, filed May 23, 2013, Watanabe et al.
U.S. Appl. No. 13/863,729, filed Apr. 16, 2013, Kondo et al.
U.S. Appl. No. 13/863,803, filed Apr. 16, 2013, Kondo et al.
U.S. Appl. No. 13/864,467, filed Apr. 17, 2013, Aikawa et al.
U.S. Appl. No. 13/864,559, filed Apr. 17, 2013, Kondo et al.
U.S. Appl. No. 13/869,285, filed Apr. 24, 2013, Aikawa et al.

* cited by examiner

CERAMIC MATERIAL, LAMINATE, MEMBER FOR USE IN SEMICONDUCTOR MANUFACTURING EQUIPMENT, AND SPUTTERING TARGET MEMBER

BACKGROUND OF THE INVENTION

1. Field of the Invention

The present invention relates to a ceramic material, laminate, member for use in semiconductor manufacturing equipment, and a sputtering target member.

2. Description of Related Art

In semiconductor manufacturing equipment used for dry processes, plasma coating, and so forth in semiconductor manufacturing, a high-reactive halogen (e.g., F or Cl)-based plasma is used for etching and cleaning. Thus, members used in the semiconductor manufacturing equipment are required to have high corrosion resistance. In general, high-corrosion high-corrosion resistant metals, such as anodized aluminum and hastelloy, and ceramic members are used. In particular, materials for electrostatic chucks and heaters, which support Si wafers, are required to have high corrosion resistance and low particle emission properties. Thus, high-corrosion resistant ceramic members composed of, for example, aluminum nitride, alumina, sapphire, are used. Long-term use of these materials causes them to corrode gradually, so that particles can be emitted. Thus, a higher corrosion resistant material is required. To meet the needs, studies have been conducted on the use of magnesia, spinel ($MgAl_2O_4$), composite materials thereof, which have higher corrosion resistance than alumina and so forth (for example, Patent Document 1).

Furthermore, finer lines require members, such as electrostatic chucks and heaters, which support Si wafers, to have excellent temperature uniformity. To improve the temperature uniformity, a material having high thermal conductivity is preferably used. Examples of the material include aluminum nitride, alumina, and yttria. Among these compounds, aluminum nitride has particularly high thermal conductivity and thus can exhibit high temperature uniformity. However, aluminum nitride is known to have low corrosion resistance against a plasma, compared with alumina and yttria.

Furthermore, magnesium oxide is used for refractory materials, various additives, electronic components, fluorescent materials, various target materials, underlying materials for superconducting thin films, tunnel barriers of magnetic tunnel junction devices (MTJ devices), protective films for color plasma displays (PDPs), and used as a raw material for crystalline magnesium oxide layers for PDPs. Thus, magnesium oxide has been attracting attention as a material having a very wide range of applications. In particular, magnesium oxide is used as a sputtering target material to produce tunnel barriers of MTJ devices using the tunneling magnetoresistive effect and protective films for dielectrics and electrodes of PDPs. In a MTJ device including a very thin insulator, which has a thickness of several nanometers, interposed between two magnetic layers, the resistance of the device is different between when relative magnetization directions of the two magnetic layers are parallel to each other and when they are antiparallel to each other. The resistance change phenomenon is referred to as the tunneling magnetoresistive effect. The utilization of the electrical resistance change in the magnetized state enables the device to be applied to, for example, magnetic heads of hard disks.

CITATION LIST

Patent Literature

[Patent Document 1] JP 3559426 B p However, magnesium oxide reacts with moisture and carbon dioxide in air to form hydroxide and carbonate. Thus, the surface of magnesium oxide is gradually altered (problem of moisture resistance). In the case where magnesium oxide is used for a member for semiconductor manufacturing equipment, hydroxide and carbonate are disadvantageously decomposed to form gases, so that magnesium oxide is formed into particles, thereby emitting particles to contaminate a semiconductor device. Thus, application of magnesium oxide has been limited.

Meanwhile, spinel has adequate moisture resistance and high corrosion resistance against a halogen-based plasma, compared with alumina and so forth. However, the corrosion resistance of spinel is still insufficient.

Also in the case of a composite material of magnesium oxide and spinel, at a high magnesium oxide content, the moisture resistance is a problem. At a low magnesium oxide content, although the degree of the moisture resistance problem is low, the composite material has corrosion resistance close to spinel. Thus, the degree of superiority over alumina and so forth is low.

In general, materials having high corrosion resistance against halogen-based plasmas include magnesium oxide, spinel, alumina, and aluminum nitride. Among these compounds, aluminum nitride has outstanding thermal conductivity and thus is the most preferable material to exhibit temperature uniformity. That is, in order to achieve both corrosion resistance and temperature uniformity, a structure in which aluminum nitride and a material having high corrosion resistance are stacked is preferred. However, a difference in thermal expansion between aluminum nitride and the material having high corrosion resistance is large. Thus, in the case where both are stacked and then fired, cracks are disadvantageously formed.

SUMMARY OF THE INVENTION

The present invention has been made to overcome the foregoing problems. It is an object of the present invention to provide a ceramic material having corrosion resistance against a halogen-based plasma, the corrosion resistance being comparable to or higher than that of spinel. It is another object of the present invention to provide a ceramic material having corrosion resistance comparable to spinel, having a lower linear thermal expansion coefficient than spinel, and being close to aluminum nitride that can exhibit high temperature uniformity.

In recent years, magnetoresistive random access memories (hereinafter, also referred to as "MRAMs") using MTJ devices described above have been studied. MRAMs include, for example, a large number of MTJ devices arranged, magnetization arrangements serving as information carriers. MRAMs have features, such as nonvolatility, high speed, and high rewrite durability. Thus, there have been advances in the development of MRAMs as memories that exceed conventional semiconductor memories (DRAMs). In the past, prototype memories each having a storage capacity of several to several tens of megabits (Mbit) have been made. For example, in order to replace DRAMs, it is necessary to further increase the capacity to a gigabit (Gbit) class capacity.

Hitherto, as a material for a tunnel barrier of a MTJ device, single-crystal or high-pure magnesium oxide have been commonly used. It has been common to form a tunnel barrier using a sputtering target material of magnesium oxide. However, to further increase the capacity, the MTJ device is required to have a low electrical resistance and high magnetoresistance ratio for providing a higher output signal.

The present invention has been made to overcome the foregoing problems. It is another object of the present invention to provide a sputtering target having a lower electrical resistance than magnesium oxide. The use of the target for the production of a magnetic tunnel junction device should result in a reduction in electrical resistance.

The inventors have conducted intensive studies on the corrosion resistance of a ceramic material formed by compacting a mixed powder of magnesium oxide, alumina, and aluminum nitride and subjecting the resulting compact to hot-press sintering and have found that a ceramic material containing magnesium-aluminum oxynitride serving as a main phase, has very high corrosion resistance, in which an XRD peak of magnesium-aluminum oxynitride appears at a specific position. This finding has led to the completion of the present invention.

A ceramic material of the present invention comprises: magnesium, aluminum, oxygen, and nitrogen, which are main components, wherein the ceramic material has a magnesium-aluminum oxynitride phase serving as a main phase, wherein an XRD peak of the magnesium-aluminum oxynitride phase measured with CuKα radiation appears at at least 2θ=47 to 50°.

A laminate of the present invention has a structure including a first structure that contains the ceramic material described above and a second structure having a main phase composed of at least one of aluminum nitride, yttrium oxide, and aluminum oxide, in which the first structure and the second structure are stacked or joined.

A member for use in semiconductor manufacturing equipment of the present invention includes the ceramic material or the laminate.

A sputtering target member of the present invention is composed of the ceramic material.

The ceramic material of the present invention has corrosion resistance comparable to or higher than spinel. Thus, the member composed of the ceramic material for use in semiconductor manufacturing equipment can withstand a high-reactive halogen (e.g., F or Cl)-based plasma used in a semiconductor fabrication process for prolonged periods of time and can reduce the amount of particles emitted from the member. Among the ceramic materials of the present invention, the material having corrosion resistance comparable to spinel can have a lower linear thermal expansion coefficient than spinel. It is thus possible to relatively easily provide the laminate with a material, such as aluminum nitride having high temperature uniformity and a low linear thermal expansion coefficient.

The ceramic material of the present invention has a lower electrical resistance than magnesium oxide. Thus, when a sputtering target member composed of the ceramic material is used to produce, for example, a tunnel barrier of a magnetic tunnel junction device, the resulting magnetic tunnel junction device should have a lower electrical resistance than magnesium oxide, in which the tunnel barrier containing magnesium, aluminum, oxygen, and nitrogen. Furthermore, it is possible to provide a magnetic tunnel junction device having a high magnetoresistance ratio.

DETAILED DESCRIPTION OF THE INVENTION

Figure 1:
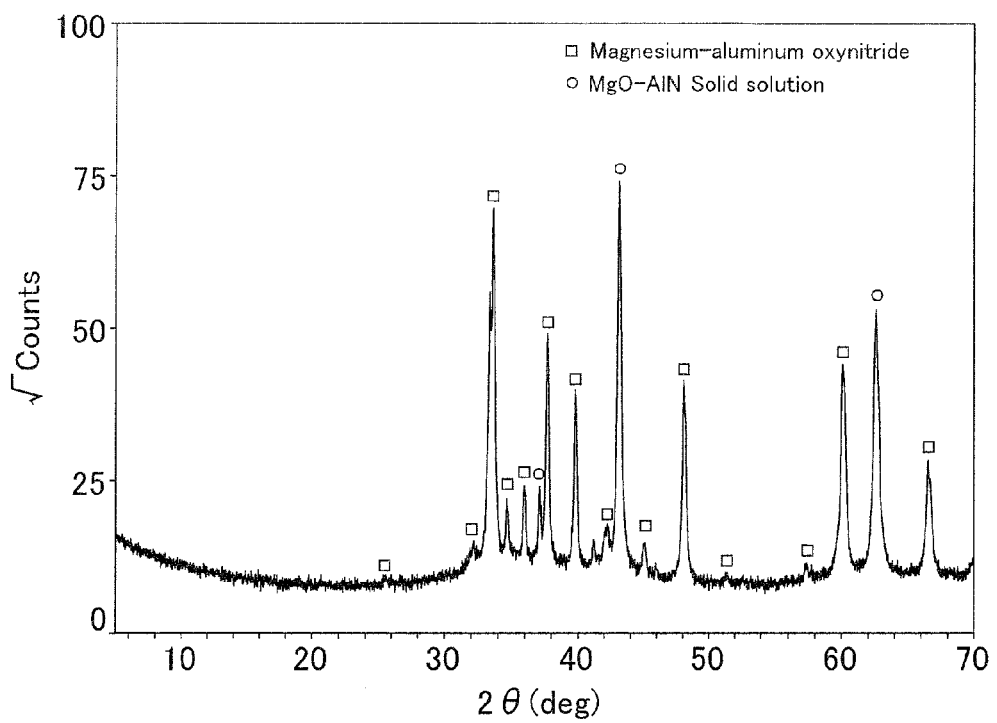
FIG. 1 is an X-ray diffraction (XRD) analysis chart in Experimental Example 1.

A ceramic material of the present invention mainly contains magnesium, aluminum, oxygen, and nitrogen, in which the ceramic material has a magnesium-aluminum oxynitride phase serving as a main phase, and an XRD peak of the magnesium-aluminum oxynitride phase measured with CuKα radiation appears at at least 2θ=47 to 50°. The corrosion resistance of the magnesium-aluminum oxynitride against a halogen-based plasma is comparable to or higher than that of spinel. It is thought that the ceramic material of the present invention has the oxynitride as a main phase and thus has high corrosion resistance. Furthermore, magnesium-aluminum oxynitride can have a lower linear thermal expansion coefficient than spinel while having corrosion resistance comparable to spinel.

The ceramic material of the present invention may contain a crystal phase of a MgO—AlN solid solution in which aluminum nitride is dissolved in magnesium oxide, the crystal phase serving as a subphase. The MgO—AlN solid solution also has high corrosion resistance. Thus, when the MgO—AlN solid solution is contained as a subphase, there is no problem. XRD peaks corresponding to the (200) and (220) planes of the MgO—AlN solid solution measured with CuKα radiation may appear at 2θ=42.9 to 44.8° and 62.3 to 65.2°, respectively, the XRD peaks being located between peaks of cubic magnesium oxide and peaks of cubic aluminum nitride. Furthermore, an XRD peak corresponding to the (111) plane may appear at 2θ=36.9 to 39°, the XRD peak being located between a peak of cubic magnesium oxide and a peak of cubic aluminum nitride. The peak corresponding to the (111) plane is not clearly distinguished from peaks corresponding to other crystal phases, in some cases. For this reason, only the XRD peaks corresponding to the (200) and (220) planes may appear in the ranges described above. Similarly, the peak corresponding to the (200) or (220) plane is not clearly distinguished from peaks corresponding to other crystal phases, in some cases.

When the ceramic material of the present invention contains an AlN crystal phase as a subphase, the ceramic material tends to have reduced corrosion resistance. To obtain corrosion resistance comparable to or higher than spinel, thus, the ceramic material preferably has a lower AlN crystal phase content. More preferably, the ceramic material does not contain the AlN crystal phase. Spinel has higher corrosion resistance than alumina and the AlN crystal. Thus, the ceramic material may contain a small amount of spinel. However, spinel has inferior corrosion resistance to the magnesium-aluminum oxynitride phase and the MgO—AlN solid solution of the present invention. Thus, a lower spinel content is preferred. Meanwhile, in order to provide the ceramic material having a reduced linear thermal expansion coefficient and having corrosion resistance comparable to spinel, the ceramic material may contain spinel and AlN crystal phase in low amounts.

To provide the ceramic material of the present invention having corrosion resistance comparable to or higher than spinel, the molar ratio of magnesium/aluminum in a raw material powder is preferably in the range of 0.20 to 2. More preferably, the molar ratio of magnesium/aluminum is in the range of 0.75 to 2. A molar ratio of magnesium/aluminum of less than 0.20 can result in an increase in the amount of any of aluminum nitride, spinel, and aluminum oxide formed, causing a loss of the high corrosion resistance properties. A molar ratio of magnesium/aluminum exceeding 2 is more likely to cause the MgO—AlN solid solution to be a main phase. Meanwhile, in order to provide the ceramic material having a reduced linear thermal expansion coefficient and having corrosion resistance comparable to spinel, the molar ratio of magnesium/aluminum in the raw material powder is preferably in the range of 0.05 to 1.5. More preferably the molar ratio of magnesium/aluminum is in the range of 0.1 to 1.

The ceramic material of the present invention preferably has an open porosity of 5% or less. Here, the open porosity is defined as a value measured by Archimedes' method using pure water as a medium. An open porosity exceeding 5% can result in a reduction in strength and can be liable to cause particle emissions by the shedding of the material itself. Furthermore, for example, dust components are liable to be accumulated in the pores at the time of processing of the material, which is not preferred. The open porosity is preferably as close to zero as possible. Thus, the lower limit is not particularly set.

The ceramic material of the present invention may be contained in a laminate having a first structure and a second structure, the first structure containing the foregoing ceramic material, and the second structure having a main phase composed of at least one of aluminum nitride, yttrium oxide, and aluminum oxide. The laminate may have a structure in which the first structure and the second structure are stacked or joined. In this case, the use of the first structure having high corrosion resistance and the second structure having other properties (e.g., heat transfer and mechanical strength) different from those of the first structure can enhance other properties in addition to corrosion resistance. Here, the first structure may be a thin film, a plate-like structure, or a laminar structure, which is composed of the foregoing ceramic material. The second structure may be a thin film, a plate-like structure, or a laminar structure, which has a main phase composed of aluminum nitride, yttrium oxide, or aluminum oxide. The joining may be performed by any method. For example, the structures may be joined by sintering or with an adhesive.

In the laminate of the present invention, the first structure and the second structure may be joined with an intermediate layer therebetween. In this case, for example, the presence of the intermediate layer can further prevent the delamination between the first structure and the second structure due to, for example, a difference in thermal expansion coefficient. The intermediate layer may have properties intermediate between the first structure and the second structure. For example, the intermediate layer may be a layer in which a main phase of the first structure is mixed with the main phase of the second structure. Furthermore, the intermediate layer may include a plurality of sublayers having different constituents or different ratios of constituents. In this case, the intermediate layer can have properties similar to those of a gradient material.

In the laminate of the present invention, a difference in linear thermal expansion coefficient between the first structure and the second structure may be 0.3 ppm/K or less, and the first structure and the second structure may be directly joined together. In this case, a small difference in linear thermal expansion coefficient between the first structure and the second structure eliminates the possibility of the occurrence of cracking or delamination when both the structures are joined (for example, joined by sintering) at a high temperature or when the laminate is repeatedly used at a high temperature and a low temperature.

The ceramic material of the present invention may be used for a member for use in semiconductor manufacturing equipment. Examples of the member for use in semiconductor manufacturing equipment include electrostatic chucks, susceptors, heaters, plates, inner wall materials, monitoring windows, microwave-introducing windows, and microwave coupling antennae, which are used in semiconductor manufacturing equipment. They are required to have excellent resistance to corrosion by the plasma of a halogen element-containing corrosive gas. Thus, the ceramic material of the present invention is preferably used therefor.

In the ceramic material of the present invention, the magnesium-aluminum oxynitride serving as the main phase has a linear thermal expansion coefficient of 6 to 7 ppm/K at 40° C. to 1000° C. Thus, by changing proportions of the MgO—AlN solid solution (12 to 14 ppm/K), spinel (8 to 9 ppm/K), and aluminum nitride (5 to 6 ppm/K), which are subphases, the ceramic material can be controlled to have a linear thermal expansion coefficient of 5.5 to 10 ppm/K while maintaining high corrosion resistance. However, spinel and aluminum nitride have lower corrosion resistance than magnesium-aluminum oxynitride and the MgO—AlN solid solution. Thus, lower proportions of spinel and aluminum nitride are preferred. Such adjustment of the thermal expansion enables the thermal expansion of the ceramic material to be matched with the thermal expansion of a material, for example, aluminum oxide, yttrium oxide, or aluminum nitride, for a member for use in semiconductor manufacturing equipment. Alternatively, it is possible to reduce a difference in thermal expansion between the ceramic material and the material for the member. Thus, the ceramic material of the present invention and a known material can be laminated or bonded together. In this case, the ceramic material, having high corrosion resistance, of the present invention can be used for only a surface (first structure), and a known material can be used as a base material for a lower portion (second structure). In the case of co-sintering, such a laminated structure and adjustment of thermal expansion are particularly effective. In particular, when a material mainly containing aluminum nitride is used as a base material of the second structure, high thermal conduction can be maintained. This is more likely to uniformly maintain the surface temperature of the ceramic material having high corrosion resistance. Such a structure is particularly effective for semiconductor manufacturing equipment with a built-in heater.

The ceramic material of the present invention may be used for a sputtering target member. That is, a sputtering target member of the present invention may be composed of a ceramic material mainly containing magnesium, aluminum, oxygen, and nitrogen, in which the ceramic material has a magnesium-aluminum oxynitride phase serving as a main phase, and an XRD peak of the magnesium-aluminum oxynitride phase measured with CuKα radiation appears at at least 2θ=47 to 50°. The ceramic material of the present invention has a lower electrical resistance than magnesium oxide and thus is preferably used for a sputtering target member. For example, the sputtering target member may be a member used to produce a tunnel barrier of a magnetic tunnel junction device. In this case, the ceramic material of the present invention is preferably used to produce at least one magnetic tunnel junction device selected from magnetic heads of hard disks and magnetoresistive random access memories. They are required to have low electrical resistances and high magnetoresistance ratios. Thus, the ceramic material of the present invention is preferably used therefor.

The ceramic material of the present invention may be produced by compacting a mixed powder of magnesium oxide, alumina, and aluminum nitride and sintering the resulting compact. To obtain corrosion resistance comparable to or higher than spinel, for example, a mixed powder containing 15% by mass to 66.2% by mass magnesium oxide, 63% by mass or less alumina, and 57.7% by mass or less aluminum nitride may be compacted and then fired. Furthermore, a mixed powder containing 37% by mass to 66.2% by mass magnesium oxide, 63% by mass or less alumina, and 57.7% by mass or less aluminum nitride may be compacted and then fired. Meanwhile, in order to provide a ceramic material having a low linear thermal expansion coefficient and high temperature uniformity while having corrosion resistance comparable to spinel, a mixed powder containing 5% by mass to 60% by mass magnesium oxide, 60% by mass or less alumina, and 90% by mass or less aluminum nitride may be compacted and then fired. The sintering temperature is preferably 1750° C. or higher. A sintering temperature of less than 1750° C. can fail to provide target magnesium-aluminum oxynitride and is not preferred. The upper limit of the sintering temperature is not particularly limited and may be, for example, 1850° C. or 1900° C. As the sintering, hot-press sintering is preferably employed. The hot-press sintering is preferably performed at a pressing pressure of 50 to 300 kgf/cm². An atmosphere during the sintering is preferably an atmosphere that does not affect the sintering of the oxide raw materials. Preferred examples thereof include a nitrogen atmosphere and inert atmospheres, such as an argon atmosphere and a helium atmosphere. The pressure during the compacting is not particularly limited and may be appropriately set to a pressure such that the shape is maintained.

EXAMPLES

Preferred application examples of the present invention will be described below. Commercial items each having a purity of 99.9% by mass or more and an average particle size of 1 μm or less were used as raw material MgO, raw material $Al_2O_3$, and raw material AlN. Here, with respect to raw material AlN, an oxygen contamination of about 1% by mass is inevitable. Thus, the foregoing purity is a value on the basis of impurity elements excluding oxygen. Note that with respect to raw material MgO, when raw material MgO having a purity of 99% by mass or more was used, it was possible to produce a ceramic material comparable to a ceramic material produced when raw material MgO having a purity of 99.9% by mass or more was used.

1. Ceramic Material

Ceramic materials each of which mainly contains magnesium, aluminum, oxygen, and nitrogen will be described below (Experimental Examples 1 to 19). Experimental Examples 1 to 3 and 6 to 16 correspond to examples of the present invention. Experimental Examples 4, 5, and 17 to 19 correspond to Comparative Examples.

Experimental Examples 1 to 3

Preparation

Raw material MgO, raw material $Al_2O_3$, and raw material AlN were weighed in amounts (% by mass) described in Table 1. These materials were wet-mixed for 4 hours in a nylon pot with alumina balls each having a diameter of 5 mm using isopropyl alcohol as a solvent. After the completion of the mixing, the resulting slurry was taken out and dried at 110° C. in a stream of nitrogen. Then the mixture was passed through a 30-mesh sieve to provide a mixed powder. The ratio by mole of Mg/Al of the mixed powder was 1.2.

Compacting

The mixed powder was subjected to uniaxial pressing at 200 kgf/cm² to form a disk-like formed article having a diameter of about 35 mm and a thickness of about 10 mm. The formed article was accommodated in a graphite mold for sintering.

Sintering

The disk-like formed article was subjected to hot-press sintering to provide a ceramic material. The hot-press sintering was performed at a pressing pressure of 200 kgf/cm² and a sintering temperature (maximum temperature) described in Table 1. An Ar atmosphere was maintained until the sintering was completed. The holding time at the sintering temperature was 4 hours.

Experimental Example 4

A ceramic material was prepared as in Experimental Example 1, except that raw material MgO and raw material $Al_2O_3$ were weighed in amounts (% by mass) described in Table Experimental Example 5

A ceramic material was prepared as in Experimental Example 1, except that the sintering temperature was 1650° C.

Experimental Examples 6 to 12

Ceramic materials were each prepared as in Experimental Example 1, except that raw material MgO, raw material $Al_2O_3$, and raw material AlN were weighed in amounts (% by mass) described in Table 1 and that the sintering temperature was set to a value described in Table 1.

Experimental Examples 13 to 19

Ceramic materials were each prepared as in Experimental Example 1, except that raw material MgO, raw material $Al_2O_3$, and raw material AlN were weighed in amounts (% by mass) described in Table 1, the sintering temperature was set to a value described in Table 1, and the atmosphere during the sintering was $N_2$.

Evaluation

Each of the materials produced in Experimental Examples 1 to 19 was processed for various evaluations, the following evaluations were made. Table 1 illustrates the evaluation results. In Experimental Examples 1 to 19, samples each having a diameter of 50 mm were produced. The evaluation results of these samples were the same as those described in Table 1.

(1) Bulk Density and Open Porosity

The bulk density and open porosity were measured by Archimedes' method using pure water as a medium.

(2) Crystal Phase Evaluation

Each of the materials was pulverized with a mortar. The crystal phase was identified with an X-ray diffractometer. The measurement was performed with a sealed tube-type X-ray diffractometer (D8 ADVANCE, manufactured by Bruker AXS) operating at 40 kV and 40 mA and using CuKα radiation in the range of 2θ between 5° and 70°.

(3) Etch Rate

A surface of each of the materials was mirror-polished. A corrosion resistance test was performed with an inductively coupled plasma (ICP) corrosion resistance testing apparatus under conditions described below. The step height between a masked surface and an exposed surface measured with a surface profiler was divided by a testing time to calculate the etch rate of each material.

ICP: 800 W, Bias: 450 W, Introduction gas: $NF_3/O_2/Ar$=75/35/100 sccm at 0.05 Torr (6.67 Pa), Exposure time: 10 h, Sample temperature: room temperature.

(4) Constituent Elements

The detection, identification, and concentrations of constituent elements were analyzed by electron probe microanalysis (EPMA).

(5) Average Linear Thermal Expansion Coefficient (40° C. to 1000° C.)

The average linear thermal expansion coefficient was measured with a dilatometer (manufactured by Bruker AXS) in an argon atmosphere.

(6) Bending Strength

The bending strength was measured by a bending strength test according to JIS-R1601.

(7) Measurement of Volume Resistivity

The volume resistivity was measured by a method according to JIS-C2141 in air at room temperature (25° C.). A test piece had a size of φ50 mm×(0.5 to 1 mm). Electrodes composed of silver were formed in such a manner that a main electrode had a diameter of 20 mm, a guard electrode had an inside diameter of 30 mm and an outside diameter of 40 mm, and an application electrode had a diameter of 40 mm. The applied voltage was 2 kV/mm. A current value one minute after applying the voltage was read. The volume resistivity at room temperature was calculated from the current value. In each of Experimental Examples 7 and 19 (MgO sintered body), the volume resistivity was measured in vacuum (0.01 Pa or less) at 600° C. A test piece had a size of φ50 mm×(0.5 to 1 mm). Electrodes composed of silver were formed in such a manner that a main electrode had a diameter of 20 mm, a guard electrode had an inside diameter of 30 mm and an outside diameter of 40 mm, and an application electrode had a diameter of 40 mm. The applied voltage was 500 V/mm. A current value one hour after applying the voltage was read. The volume resistivity at room temperature was calculated from the current value. In the volume resistivity described in Table 1, "aEb" represents $a \times 10^b$. For example, "1E16" represents $1 \times 10^{16}$.

Evaluation Results

An X-ray diffraction (XRD) analysis chart of Experimental Example 1 is illustrated in FIG. 1. Note that XRD analysis charts in Experimental Examples 2 and 3 are substantially the same as that in Experimental Example 1 and thus are not illustrated. Crystal phases detected in Experimental Examples 1 to 19 are described in Table 1. As illustrated in FIG. 1, each of the XRD charts of the ceramic materials prepared in Experimental Examples 1 to 3 indicated a plurality of non-identifiable peaks (symbol "□" in FIG. 1) and peaks (symbol "○" in FIG. 1) assigned to a MgO—AlN solid solution in which aluminum nitride was dissolved in magnesium oxide. In the non-identifiable peaks (□), a peak observed at 2θ=47 to 49° (47 to 50°) was not assigned to any of magnesia, spinel, and aluminum nitride and was presumed to be one assigned to magnesium-aluminum oxynitride. These peaks assigned to magnesium-aluminum oxynitride are not matched to peaks assigned to MgAlON (or magalon) described in, for example, Reference Document 1 (J. Am. Ceram. Soc., 93[2]322-325 (2010)) or Reference Document 2 (Japanese Unexamined Patent Application Publication No. 2008-115065). In general, MgAlON is known to be a solid solution in which an N component is dissolved in spinel, and is thought to have a crystal structure different from that of magnesium-aluminum oxynitride of the present invention.

Figure 2:
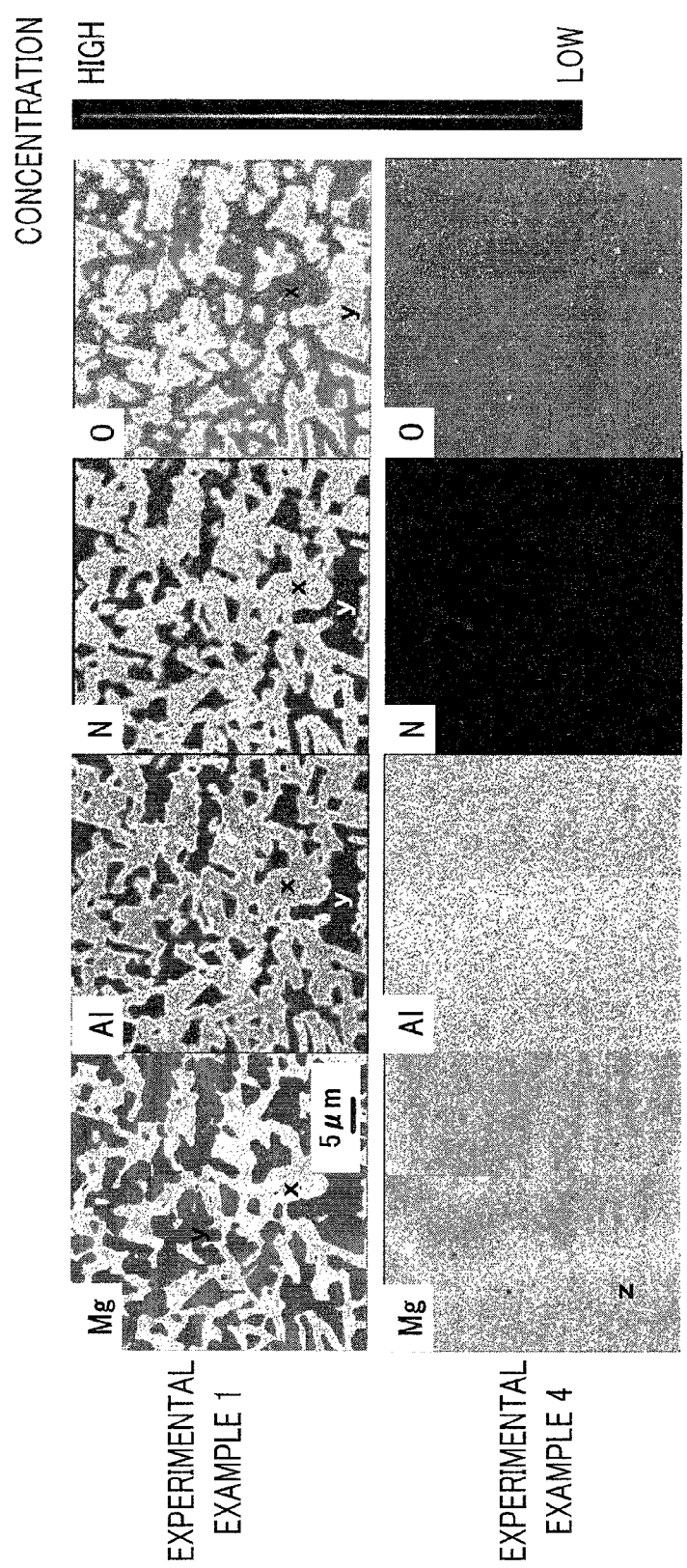
FIG. 2 illustrates element mapping images in Experimental Examples 1 and 4 by electron probe microanalysis (EPMA).

XRD peaks corresponding to the (111), (200), and (220) planes of the MgO—AlN solid solution appeared at 2θ=36.9 to 39°, 42.9 to 44.8°, 62.3 to 65.2°, respectively, the XRD peaks being located between peaks of cubic magnesium oxide and peaks of cubic aluminum nitride. Element mapping images obtained by electron probe microanalysis (EPMA) in Experimental Example 1 are illustrated in FIG. 2. From FIG. 2, it was found that in Experimental Example 1, the ceramic material had two phases, i.e., magnesium-aluminum oxynitride (x portions) and the MgO—AlN solid solution (y portions) illustrated in FIG. 1, the former serving as a main phase. Here, the main phase indicates a component whose volume fraction is 50% or more. The subphase indicates a phase other than the main phase, XRD peaks of the subphase being identified. It is thought that in the observation of a cross section, the area fraction reflects the volume fraction. Thus, the main phase is defined as a region having an area fraction of 50% or more in an element mapping image obtained by EPMA. The subphase is defined as a region other than the main phase. From FIG. 2, it was found that the area fraction of magnesium-aluminum oxynitride was about 66% and that thus magnesium-aluminum oxynitride served as a main phase. The x portions were identified as magnesium-aluminum oxynitride on the grounds that the x portions were composed of four components of Mg, Al, O, and N and had high Mg and N concentrations, a comparable Al concentration, and a low O concentration, as compared with spinel material (z portion) prepared in Experimental Example 4. That is, this magnesium-aluminum oxynitride is characterized by having a higher Mg content than spinel. The same analysis was conducted on other experimental examples. For example, the area fraction of magnesium-aluminum oxynitride prepared in Experimental Example 10 was about 87%. This indicated that magnesium-aluminum oxynitride served as a main phase. Here, as an example, the identification of the main phase and the subphase were performed by the element mapping by EPMA. Alternatively, any other methods that can distinguish the volume fractions of the phases may be employed.

In the element mapping images by EPMA, different concentrations are indicated by different colors: red, orange, yellow, yellowish green, green, blue, and indigo blue. Red indicates the highest concentration. Indigo blue indicates the lowest concentration. Black indicates zero. However, FIG. 2 illustrates monochrome images. Thus, the images of FIG. 2 will be described below using the original colors. In Experimental Example 1, for Mg, the x portions were indicated by yellowish green, and the y portions were indicated by red. For Al, the x portions were indicated by orange, and the y portions were indicated by blue. For N, the x portions were indicated by orange, and the y portions were indicated by blue. For O, the x portions were indicated by light blue, and the y portions were indicated by orange. In Experimental Example 4, for Mg, the entire area (z portion) was indicated by green. For Al, the entire area was indicated by orange. For N, the entire area was indicated by black. For O, the entire area was indicated by red.

Figure 3:
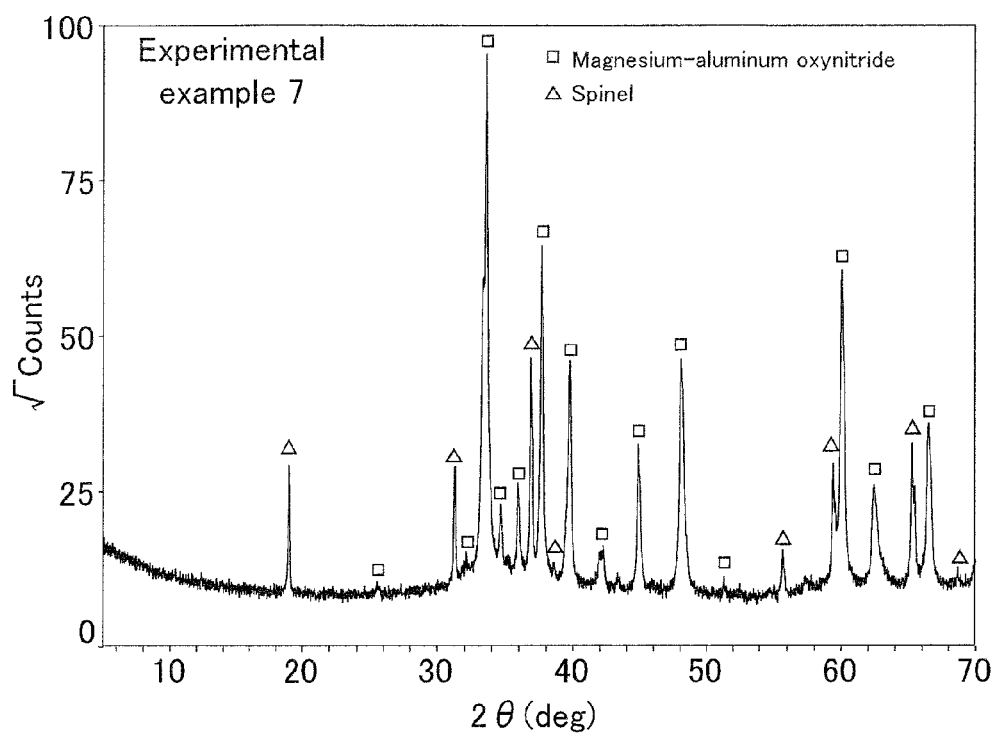
FIG. 3 is an XRD analysis chart in Experimental Example 7.
Figure 4:
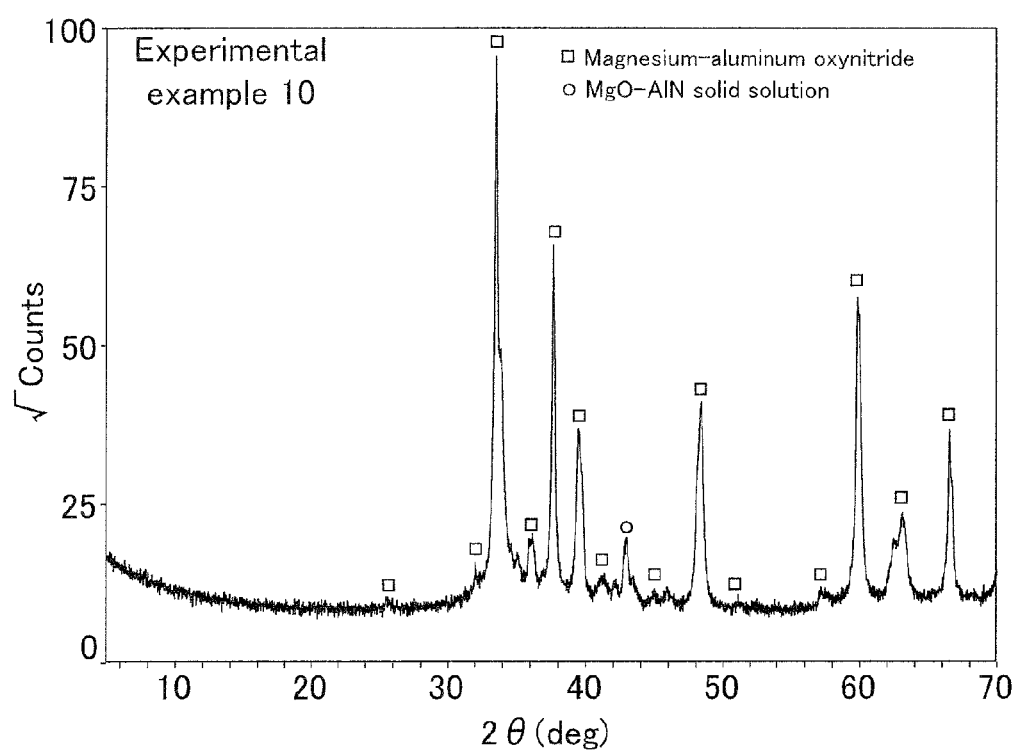
FIG. 4 is an XRD analysis chart in Experimental Example 10.

In Experimental Example 4, aluminum nitride was not used, so that magnesium-aluminum oxynitride described above was not formed. The resulting ceramic material contained spinel ($MgAl_2O_4$) as a main phase. In Experimental Example 5, the sintering temperature was low, so that magnesium-aluminum oxynitride described above was not formed. The resulting ceramic material contained magnesium oxide as a main phase and spinel and aluminum nitride as subphases. FIG. 3 is an XRD analysis chart in Experimental Example 7. FIG. 4 is an XRD analysis chart in Experimental Example 10. From FIGS. 3 and 4, in each of Experimental Examples 7 and 10, magnesium-aluminum oxynitride (symbol "□" in the figure) exhibiting a peak at 2θ=47 to 49° (or 47 to 50°) was mainly detected. In Experimental Example 7, spinel (symbol "Δ" in the figure) was found to be a subphase. In Experimental Example 10, the MgO—AlN solid solution (symbol "O" in the figure) was found to be a subphase. In Experimental Examples 6, 8, 9, 11, and 12, XRD analysis charts were not illustrated, and main phases and subphases were described in Table 1.

The ceramic materials prepared in Experimental Examples 1 to 3 and 6 to 8 had low etch rates of 80% or less of the ceramic material prepared in Experimental Example 4. The ceramic materials prepared in Experimental Examples 9 to 12 had low etch rates of 90% or less of the ceramic material prepared in Experimental Example 4. The results demonstrated that the ceramic materials prepared in Experimental Examples 1 to 3 and 6 to 8 had very high corrosion resistance. The ceramic material prepared in Experimental Example 5 had high proportions of spinel and aluminum nitride, which have low corrosion resistance, and thus had high etch rates. The etch rate of alumina prepared in Experimental Example 18 is higher than that of the ceramic material (spinel) prepared in Experimental Example 4. The ceramic materials prepared in Experimental Examples 1 to 3 and 6 to 8 had sufficiently high bending strength and volume resistivities.

The etch rate at a high temperature was also measured. Here, a surface of the ceramic material prepared in each of Experimental Examples 2 and 10 was mirror-polished. A high-temperature corrosion resistance test was performed with an inductively coupled plasma (ICP) corrosion resistance testing apparatus under conditions described below. The step height between a masked surface and an exposed surface measured with a surface profiler was divided by a testing time to calculate the etch rate of each material. The etch rate of each material was ⅓ or less times the etch rate of alumina, was ⅕ or less times the etch rate of aluminum nitride, and was comparable to spinel. That is, the ceramic materials had satisfactory plasma corrosion resistance at a high temperature.

ICP: 800 W, Bias: not applied, Introduction gas: $NF_3$/Ar=300/300 sccm at 0.1 Torr, Exposure time: 5 h, Sample temperature: 650° C.

The ceramic materials prepared in Experimental Examples 12 to 16 had etch rates (212 to 270 nm/h) nearly the same as the etch rate of spinel prepared in Experimental Example 4 and had lower linear thermal expansion coefficients (5.8 to 6.9 ppm/K) than spinel. That is, the ceramic materials prepared in Experimental Examples 12 to 16 had corrosion resistance comparable to spinel and lower linear thermal expansion coefficients than spinel. Thus, the ceramic materials are useful as materials for electrostatic chucks and heaters. In particular, the ceramic materials are useful as materials for heaters. In Experimental Example 17, although the raw material composition was the same as that in Experimental Example 6, the sintering temperature was low. Thus, the main phase was not magnesium-aluminum oxynitride but spinel. As a result, the ceramic material had low corrosion resistance and a high linear thermal expansion coefficient, compared with Experimental Example 6. The ceramic materials prepared in Experimental Examples 12 to 16 had sufficiently high bending strength and volume resistivities.

The volume resistivities of the ceramic materials prepared in Experimental Examples 7 and 19 at 600° C. were $5\times10^8$ Ωcm and $2\times10^{12}$ Ωcm, respectively. The results demonstrated that the ceramic material having a main phase composed of the magnesium-aluminum oxynitride phase that exhibited an XRD peak appearing at at least 2θ=47 to 49° (or 47 to 50°) had low electrical resistance compared with MgO.

Accordingly, the ceramic materials prepared in Experimental Examples 1 to 3 and 6 to 16 are speculated to have lower electrical resistances than magnesium oxide. Thus, in the case where the materials are used as sputtering targets to produce magnetic tunnel junction devices, such as magnetic heads of hard disks and magnetoresistive random access memories, the electrical resistance and/or magnetoresistance ratio should be improved.

TABLE 1

| | Relationship with the present invention | First component (MgO) (% by mass) | Second component ($Al_2O_3$) (% by mass) | Third component (AlN) (% by mass) | Mg/Al Molar ratio | Sintering temperature (° C.) | Bulk density (g/cm³) | Open porosity (%) |
|---|---|---|---|---|---|---|---|---|
| Experimental example 1 | Example | 51.6 | 21.9 | 26.5 | 1.2 | 1850 | 3.40 | 0.04 |
| Experimental example 2 | | 51.6 | 21.9 | 26.5 | 1.2 | 1800 | 3.37 | 0.03 |
| Experimental example 3 | | 51.6 | 21.9 | 26.5 | 1.2 | 1750 | 3.38 | 0.03 |
| Experimental example 4 | Comparative example | 28.2 | 71.8 | — | 0.5 | 1850 | 3.57 | 0.01 |
| Experimental example 5 | | 51.6 | 21.9 | 26.5 | 1.2 | 1650 | 3.47 | 0.01 |
| Experimental example 6 | example | 33.3 | 30.2 | 36.4 | 0.7 | 1775 | 3.28 | 0.02 |
| Experimental example 7 | | 27.6 | 32.8 | 39.6 | 0.4 | 1800 | 3.30 | 0.02 |
| Experimental example 8 | | 33.9 | 22.3 | 43.8 | 0.6 | 1800 | 3.28 | 0.01 |
| Experimental example 9 | | 28.1 | 24.3 | 47.7 | 0.4 | 1850 | 3.25 | 0.02 |
| Experimental example 10 | | 28.1 | 24.3 | 47.7 | 0.4 | 1800 | 3.26 | 0.02 |
| Experimental example 11 | | 28.1 | 24.3 | 47.7 | 0.4 | 1750 | 3.26 | 0.03 |
| Experimental example 12 | | 18.6 | 27.5 | 54.0 | 0.3 | 1800 | 3.33 | 0.02 |
| Experimental example 13 | | 9.6 | 11.0 | 79.4 | 0.1 | 1800 | 3.27 | 0.01 |
| Experimental example 14 | | 9.6 | 11.0 | 79.4 | 0.1 | 1850 | 3.27 | 0.08 |

TABLE 1-continued

| | | | | | | | |
|---|---|---|---|---|---|---|---|
| Experimental example 15 | | 24.2 | 25.5 | 50.2 | 0.4 | 1800 | 3.27 | 0.12 |
| Experimental example 16 | | 9.4 | 19.4 | 71.2 | 0.1 | 1900 | 3.27 | 0.02 |
| Experimental example 17 | Comparative example | 33.3 | 30.2 | 36.4 | 0.7 | 1700 | 3.28 | 0.03 |
| Experimental example 18 | | 0 | 100 | 0 | — | 1700 | 3.94 | 0.01 |
| Experimental example 19 | | 100 | 0 | 0 | — | 1500 | 3.57 | 0.30 |

| | Relationship with the present invention | Crystal phase | | $NF_3$ Etch rate (nm/h) | Linear thermal expansion coefficient @40~1000° C. | Strength (MPa) | Volume resistivity @25° C. ($\Omega \cdot cm$) | Volume resistivity @600° C. ($\Omega \cdot cm$) |
|---|---|---|---|---|---|---|---|---|
| | | Main phase | Subphase | | | | | |
| Experimental example 1 | Example | Mg—Al—O—N* | MgO—AlNss** | 176 | 9.5 | 240 | >1E16 | — |
| Experimental example 2 | | Mg—Al—O—N* | MgO—AlNss** | 177 | 9.3 | 291 | >1E16 | — |
| Experimental example 3 | | Mg—Al—O—N* | MgO—AlNss** | 179 | 9.6 | 320 | >1E16 | — |
| Experimental example 4 | Comparative example | $MgAl_2O_4$ | None | 244 | 8.6 | 168 | >1E16 | — |
| Experimental example 5 | | MgO | $MgAl_2O_4$, AlN | 224 | >10 | 350 | >1E16 | — |
| Experimental example 6 | example | Mg—Al—O—N* | MgO—AlNss** $MgAl_2O_4$ | 181 | 7.7 | 236 | >1E16 | — |
| Experimental example 7 | | Mg—Al—O—N* | $MgAl_2O_4$ | 191 | 7.3 | 242 | >1E16 | 5E8 |
| Experimental example 8 | | Mg—Al—O—N* | MgO—AlNss** | 195 | 7.6 | 272 | >1E16 | — |
| Experimental example 9 | | Mg—Al—O—N* | MgO—AlNss** | 210 | 7.1 | 233 | >1E16 | — |
| Experimental example 10 | | Mg—Al—O—N* | MgO—AlNss** | 209 | 7.1 | 257 | >1E16 | — |
| Experimental example 11 | | Mg—Al—O—N* | MgO—AlNss** | 211 | 7.1 | 265 | >1E16 | — |
| Experimental example 12 | | Mg—Al—O—N* | AlN $MgAl_2O_4$ | 219 | 6.9 | 387 | >1E16 | — |
| Experimental example 13 | | Mg—Al—O—N* | AlN $MgAl_2O_4$ | 270 | 5.8 | 304 | >1E16 | — |
| Experimental example 14 | | Mg—Al—O—N* | AlN $MgAl_2O_4$ | 255 | 6.0 | 304 | >1E16 | — |
| Experimental example 15 | | Mg—Al—O—N* | $MgAl_2O_4$ | 212 | 6.9 | 283 | >1E16 | — |
| Experimental example 16 | | Mg—Al—O—N* | AlN $MgAl_2O_4$ | 230 | 6.2 | 320 | >1E16 | — |
| Experimental example 17 | Comparative example | $MgAl_2O_4$ | AlN MgO | 256 | 8.1 | 400 | — | — |
| Experimental example 18 | | $Al_2O_3$ | None | 623 | 8.0 | 290 | — | — |
| Experimental example 19 | | MgO | — | — | — | 240 | >1E16 | 2E12 |

*Mg—Al—O—N: Magnesium-aluminum oxynitride(XRD: peaks appear at 2θ = 47-49°)
**MgO—AlNss: MgO—AlN solid solution
[—]: Not measured 2. Laminate Sintering Laminates (Experimental Examples 20 to 26) formed by subjecting a first structure composed of the foregoing ceramic material and a second structure to laminate sintering will be described below. Experimental Examples 20 to 24 correspond to examples of the present invention. Experimental Examples 25 and 26 correspond to comparative examples.

Experimental Examples 20 and 21

The ceramic materials prepared in each of Experimental Examples 4 and 6 to 12 had an average linear thermal expansion coefficient of 7 to 9 ppm/K at 40° C. to 1000° C. In each of Experimental Examples 20 and 21, as described in Table 2, the first structure was composed of the ceramic material prepared in Experimental Example 10. The second structure was composed of aluminum nitride. The first structure and the second structure were stacked and formed into a sample having a diameter of 50 mm. The sample was subjected to laminate sintering. As the aluminum nitride, aluminum nitride to which yttrium oxide serving as a sintering aid was externally added in an amount of 5% by mass (i.e., 5 parts by mass of $Y_2O_3$ was added with respect to 100 parts by mass of AlN, referred to as "AlN [1]") or in an amount of 50% by mass (i.e., 50 parts by mass of $Y_2O_3$ was added with respect to 100 parts by mass of AlN, referred to as "AlN [2]") was used. As raw material aluminum nitride and raw material yttrium oxide, commercially available items each having a purity of 99.9% by mass or more and an average particle size of 1 μm or less were used. Here, with respect to raw material AlN, an oxygen contamination of about 1% by mass is inevitable. Thus, the foregoing purity is a value on the basis of impurity elements excluding oxygen. At 40° C. to 1000° C., AlN [1] had an average linear thermal expansion coefficient of 5.7 ppm/K, and AlN [2] had an average linear thermal expansion coefficient of 6.2 ppm/K. That is, there is a difference in thermal expansion between the first structure and the second structure. Thus, an intermediate layer composed of a mixed material in which either AlN [1] or AlN [2] was mixed with the raw materials used in Experimental Example 10 was arranged between the first structure and the second structure. The intermediate layer can reduce the difference in thermal expansion. In Experimental Example 20, in which AlN [1] was used, the intermediate layer included three sublayers composed of mixed materials having mass ratios of 25:75, 50:50, and 75:25. In Experimental Example 21, in which AlN [2] was used, the intermediate layer included two sublayers composed of mixed materials having mass ratios of 40:60 and 60:40. Preparation, compacting, and sintering steps will be described in detail below.

Preparation

With respect to a material for the first structure, a prepared powder formed in the same way as Experimental Example 10 was used. With respect to a material for the second structure, aluminum nitride was used as a main phase, and the following preparation was performed. In the case of AlN [1] of the second structure, an aluminum nitride powder and an yttrium oxide powder were weighed in amounts of 100% by mass and 5.0% by mass, respectively. The powders were wet-mixed using isopropyl alcohol as a solvent in a nylon pot with nylon balls for 4 hours. After the mixing, the resulting slurry was taken out, dried in a stream of nitrogen at 110° C., and passed through a 30-mesh sieve to provide a prepared powder. The prepared powder was subjected to heat treatment at 450° C. for 5 hours or more in an air atmosphere to eliminate carbon components, with which the powder was contaminated during the wet mixing, by burning. With respect to an intermediate layer composed of AlN [1] for the laminate, the preparation was performed as described below. The prepared powder formed in Experimental Example 10 and the foregoing prepared powder of aluminum nitride were weighed so as to satisfy mass ratios of 75:25 (intermediate layer 1), 50:50 (intermediate layer 2), and 25:75 (intermediate layer 3). The powders were wet-mixed using isopropyl alcohol as a solvent in a nylon pot with nylon balls for 4 hours. After the mixing, the resulting slurry was taken out, dried in a stream of nitrogen at 110° C., and passed through a 30-mesh sieve to provide a prepared powder. AlN [2] for the second structure was prepared in the same way as AlN [1], except that the aluminum nitride powder and the yttrium oxide powder were weighed in amounts of 100% by mass and 50% by mass, respectively. With respect to an intermediate layer composed of AlN [2] for the laminate, the preparation was performed in the same way as the case of AlN [1], except that the prepared powder formed in Experimental Example 10 and the foregoing prepared powder of aluminum nitride were weighed so as to satisfy mass ratios of 60:40 (intermediate layer 1) and 40:60 (intermediate layer 2).

Compacting

First, the prepared powder of aluminum nitride, the powder serving as a raw material for the second structure, was charged into a die having a diameter of 50 mm and subjected to uniaxial pressing at 200 kgf/cm$^2$. The resulting aluminum nitride compact was not die-cut. The prepared powders were charged thereon in order of decreasing proportion of aluminum and subjected to uniaxial pressing at 200 kgf/cm$^2$ for each charged powder. Finally, the prepared powder formed in Experimental Example 10, the powder serving as a raw material for the first structure, was charged and subjected to uniaxial pressing at 200 kgf/cm$^2$. The laminate containing AlN [1] was formed of a disk-like formed article having a total thickness of 23 mm, in which the aluminum nitride layer serving as the second structure had a thickness of 10 mm, each of the three intermediate layers had a thickness of 1 mm, and the layer of the prepared powder formed in Experimental Example 10 for the first structure had a thickness of 10 mm. The laminate containing AlN [2] was formed of a disk-like formed article having a total thickness of 22 mm, in which the aluminum nitride layer serving as the second structure had a thickness of 10 mm, each of the two intermediate layers had a thickness of 1 mm, and the layer of the prepared powder formed in Experimental Example 10 for the first structure had a thickness of 10 mm. Each of the laminated disk-like formed articles was accommodated in a graphite mold for sintering.

Sintering

Each disk-like formed article accommodated in the graphite mold for sintering was subjected to hot-press sintering to provide a co-fired ceramic material. The hot-press sintering was performed at a pressing pressure of 200 kgf/cm$^2$ and a sintering temperature of 1800° C. An Ar atmosphere was maintained until the sintering was completed. The holding time at the sintering temperature was 4 hours. In each of Experimental Examples 20 and 21, the sintering at 1750° C. was also performed (Experimental Examples 20-1 and 21-1).

With respect to the sintered bodies obtained by the foregoing production method, the laminates containing AlN [1] (Experimental Examples 20 and 20-1) and the laminates containing AlN [2] (Experimental Examples 21 and 21-1) were formed of the sintered bodies and each include an upper portion composed of magnesium-aluminum oxynitride having high corrosion resistance, a lower portion mainly composed of aluminum nitride with high thermal conductivity, and the intermediate layer arranged therebetween. The intermediate layer had a gradient structure in which the AlN content of the intermediate layer was increased with increasing distance from the first structure to the second structure. These sintered bodies did not have a crack, break, or the like between the layers. This was probably because the presence of the intermediate layer between the first structure and the second structure avoided the thermal stress during the sintering. Furthermore, the control of the thermal expansion coefficient of aluminum nitride serving as a base material reduced the thermal stress generated between the base material and magnesium-aluminum oxynitride, thereby leading to the thin intermediate layer. The sintered bodies may be suitably used for members for use in semiconductor manufacturing equipment. Examples of the members include electrostatic chucks, susceptors, heaters, plates, inner wall materials, monitoring windows, microwave-introducing windows, and microwave coupling antennae.

Experimental Examples 22 to 24

In Experimental Example 22, as described in Table 2, a laminate was produced as in Experimental Example 20, except that the first structure was composed of the ceramic material prepared in Experimental Example 6, the second structure was composed of aluminum oxide, the intermediate layer was not used, and laminate sintering was performed in a N$_2$ atmosphere. In Experimental Example 23, as described in Table 2, a laminate was produced as in Experimental Example 20, except that the first structure was composed of the ceramic material prepared in Experimental Example 6, the second structure was composed of yttrium oxide, the intermediate layer was not used, and laminate sintering was performed in a N$_2$ atmosphere. In Experimental Example 24, as described in Table 2, a laminate was produced as in Experimental Example 20, except that the first structure was composed of the ceramic material prepared in Experimental Example 13, the second structure was composed of aluminum nitride (AlN [1]), the intermediate layer was not used, and laminate sintering was performed in a $N_2$ atmosphere. In each of Experimental Examples 22 to 24, there was no crack, break, or the like between the layers. Furthermore, in each of Experimental Examples 22 to 24, a difference in linear thermal expansion coefficient between the first structure and the second structure was as small as 0.3 ppm/K or less. It was thus possible to prevent the occurrence of cracking or breaking without using the intermediate layer. Similarly to Experimental Examples 20 and 21, these laminates may be suitably used for members for use in semiconductor manufacturing equipment. Examples of the members include electrostatic chucks, susceptors, heaters, plates, inner wall materials, monitoring windows, microwave-introducing windows, and microwave coupling antennae. As with Experimental Examples 20, 20-1, 21, and 21-1, the intermediate layers may be arranged in Experimental Examples 22 to 24.

Experimental Examples 25 and 26

In Experimental Example 25, as described in Table 2, a laminate was produced as in Experimental Example 20, except that the first structure was composed of alumina, the second structure was composed of aluminum nitride (AlN [1]), and laminate sintering was performed in a $N_2$ atmosphere. In Experimental Example 26, as described in Table 2, a laminate was produced as in Experimental Example 20, except that the first structure was composed of spinel, the second structure was composed of aluminum nitride (AlN [1]), and laminate sintering was performed in a $N_2$ atmosphere. In each of Experimental Examples 25 and 26, cracking occurred between the layers. This was probably because a difference in linear thermal expansion coefficient between the first structure and the second structure was excessively large, so that it was impossible to prevent cracking due to the thermal expansion difference despite the arrangement of the intermediate layer.

TABLE 2

| | Relationship with the present invention | First structure | | Second structure | | Intermediate layer | | Sintering temperature ° C. | Presence or absence of crack |
|---|---|---|---|---|---|---|---|---|---|
| | | Material | Linear thermal expansion coefficient @40~1000° C. (ppm/K) | Material | Linear thermal expansion coefficient @40~1000° C. (ppm/K) | Presence or absence | Breakdown | | |
| Experimental example 20 | Example | Experimental example 10 | 7.1 | AlN (AlN[1]) | 5.7 | Present | Three sublayers (first structure/second structure (mass ratio) of each layer = 75/25, 50/50, 25/75) | 1800 | Absent |
| Experimental example 20-1 | | Experimental example 10 | 7.1 | AlN (AlN[1]) | 5.7 | Present | Three sublayers (first structure/second structure (mass ratio) of each layer = 75/25, 50/50, 25/75) | 1750 | Absent |
| Experimental example 21 | | Experimental example 10 | 7.1 | AlN (AlN[2]) | 6.2 | Present | Two sublayers (first structure/second structure (mass ratio) of each layer = 60/40, 40/60) | 1800 | Absent |
| Experimental example 21-1 | | Experimental example 10 | 7.1 | AlN (AlN[2]) | 6.2 | Present | Three sublayers (first structure/second structure (mass ratio) of each layer = 75/25, 50/50, 25/75) | 1750 | Absent |
| Experimental example 22 | | Experimental example 6 | 7.7 | $Al_2O_3$ | 8.0 | Absent | — | 1800 | Absent |
| Experimental example 23 | | Experimental example 6 | 7.7 | $Y_2O_3$ | 7.9 | Absent | — | 1800 | Absent |
| Experimental example 24 | | Experimental example 13 | 5.8 | AlN (AlN[1]) | 5.7 | Absent | — | 1800 | Absent |
| Experimental example 25 | Comparative example | Alumina | 8.0 | AlN (AlN[1]) | 5.7 | Present | Three sublayers (first structure/second structure (mass ratio) of each layer = 75/25, 50/50, 25/75) | 1800 | Present |
| Experimental example 26 | | Spinel | 8.6 | AlN (AlN[1]) | 5.7 | Present | Three sublayers (first structure/second structure (mass ratio) of each layer = 75/25, 50/50, 25/75) | 1800 | Present |

The present application claims priority from Japanese Patent Application No. 2010-239000 filed on Oct. 25, 2010, Japanese Patent Application No. 2011-135312 filed on Jun. 17, 2011, and International patent application No. PCT/JP2011/69479 filed on Aug. 29, 2011, the entire contents of which are incorporated in the present specification by reference.

INDUSTRIAL APPLICABILITY

A ceramic material of the present invention is used for a member for use in semiconductor manufacturing equipment. Examples of the member include electrostatic chucks, susceptors, heaters, plates, inner wall materials, monitoring windows, microwave-introducing windows, and microwave coupling antennae. Alternatively, the ceramic material of the present invention is used for a sputtering target member configured to produce magnetic tunnel junction devices, such as magnetic heads of hard disks and magnetoresistive random access memories.

The invention claimed is:

1. A ceramic material comprising:
    magnesium, aluminum, oxygen, and nitrogen as main components,
    wherein a magnesium source for a starting material used to make the ceramic material consists of MgO,
    wherein the ceramic material has a magnesium-aluminum oxynitride phase serving as a main phase and an XRD peak of the magnesium-aluminum oxynitride phase measured with CuKα radiation appears at least at 2θ=47 to 50°, and
    wherein the ceramic material has an open porosity of 0.12% or less.

2. The ceramic material according to claim 1, wherein 2θ is 47 to 49°.

3. The ceramic material according to claim 1, wherein the material has a crystal phase of a MgO—AlN solid solution in which aluminum nitride is dissolved in magnesium oxide, the crystal phase serving as a subphase.

4. The ceramic material according to claim 3, wherein XRD peaks corresponding to the (200) and (220) planes of the MgO—AlN solid solution measured with CuKα radiation appear at 2θ=42.9 to 44.8° and 62.3 to 65.2°, respectively, the XRD peaks being located between peaks of cubic magnesium oxide and peaks of cubic aluminum nitride.

5. The ceramic material according to claim 4, wherein an XRD peak corresponding to the (111) plane of the MgO—AlN solid solution measured with CuKα radiation appears at 2θ=36.9 to 39°, the XRD peak being located between a peak of cubic magnesium oxide and a peak of cubic aluminum nitride.

6. The ceramic material according to claim 1, wherein the ceramic material does not contain an AlN crystal phase.

7. A member for use in semiconductor manufacturing equipment, the member comprising the ceramic material according to claim 1.

8. A sputtering target member comprising the ceramic material according to claim 1.

9. The sputtering target member according to claim 8, wherein the sputtering target member is used to produce a tunnel barrier of a magnetic tunnel junction device.

10. The sputtering target member according to claim 9, wherein the sputtering target member is used to produce at least one magnetic tunnel junction device selected from magnetic heads of hard disks and magnetoresistive random access memories.

11. A laminate comprising a structure including a first structure that contains a ceramic material, comprising magnesium, aluminum, oxygen and nitrogen as main components, wherein the ceramic material has a magnesium-aluminum oxynitride phase serving as a main phase and an XRD peak of the magnesium-aluminum oxynitrde main phase measured with CuKα radiation appears at least at 2θ=47 to 50°, and a second structure having a main phase composed of at least one of aluminum nitride, yttrium oxide, and aluminum oxide, wherein the first structure and the second structure are stacked or joined.

12. The laminate according to claim 11, wherein the first structure and the second structure are joined with an intermediate layer provided therebetween.

13. The laminate according to claim 11, wherein a difference in linear thermal expansion coefficient between the first structure and the second structure may be 0.3 ppm/K or less, and the first structure and the second structure are directly joined together.

14. The laminate according to claim 11, wherein 2θ is 47 to 49°.

15. The laminate according to claim 11, wherein the ceramic material has a crystal phase of a MgO—AlN solid solution in which aluminum nitride is dissolved in magnesium oxide, the crystal phase serving as a subphase.

16. The laminate according to claim 15, wherein XRD peaks corresponding to the (200) and (220) planes of the MgO—AlN solid solution measured with CuKα radiation appear at 2θ=42.9 to 44.8° and 62.3 to 65.2°, respectively, the XRD peaks being located between peaks of cubic magnesium oxide and peaks of cubic aluminum nitride.

17. The laminate according to claim 16, wherein an XRD peak corresponding to the (111) plane of the MgO13 AlN solid solution measured with CuKα radiation appears at 2θ=36.9 to 39°, the XRD peak being located between a peak of cubic magnesium oxide and a peak of cubic aluminum nitride.

18. The laminate according to claim 11, wherein the ceramic material does not contain an AlN crystal phase.

19. A member for use in semiconductor manufacturing equipment, the member comprising the laminate according to claim 11.

* * * * *